United States Patent
De Lacy et al.

(10) Patent No.: US 7,072,785 B2
(45) Date of Patent: Jul. 4, 2006

(54) RATE MEASUREMENT FOR ANOMALOUS TRIGGER EVENTS

(75) Inventors: John C. De Lacy, Portland, OR (US); Patrick A. Smith, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/782,585

(22) Filed: Feb. 18, 2004

(65) Prior Publication Data

US 2004/0176921 A1 Sep. 9, 2004

Related U.S. Application Data

(60) Provisional application No. 60/452,903, filed on Mar. 7, 2003.

(51) Int. Cl.
*G01R 13/00* (2006.01)

(52) U.S. Cl. ............................ 702/78; 702/66; 702/77; 702/79; 324/121 R; 324/115; 324/345; 324/440.1; 324/661

(58) Field of Classification Search ................. 702/78, 702/66–71, 80, 73–76, 120, 180, 79, 77; 345/134, 440.1, 661; 324/115, 121 R
See application file for complete search history.

(56) References Cited

U.S. PATENT DOCUMENTS

| | | | |
|---|---|---|---|
| 5,155,431 A | 10/1992 | Holcomb | |
| 6,571,185 B1 * | 5/2003 | Gauland et al. | 702/68 |
| 6,892,150 B1 * | 5/2005 | Pickerd et al. | 702/67 |
| 2004/0124848 A1 * | 7/2004 | Tran et al. | 324/543 |

* cited by examiner

*Primary Examiner*—Bryan Bui
*Assistant Examiner*—Hien Vo
(74) *Attorney, Agent, or Firm*—Thomas F. Lenihan; Moser,Patterson,Sheridan LLP

(57) ABSTRACT

A method and apparatus for processing anomalous trigger event conditions to provide anomalous trigger event rate measurements. The apparatus operates to identify one or more trigger events in at least one input signal IN, determine the number of events during a period of time (e.g. events per second) and provide a visual representation of this determination to a user via a display device. The visual representation may comprise an alphanumeric display, a waveform, a graphic image proximate a waveform and the like.

6 Claims, 2 Drawing Sheets

RATE MEASUREMENT FOR ANOMALOUS TRIGGER EVENTS

CROSS REFERENCE TO RELATED APPLICATION

This application claims the benefit of provisional patent application Ser. No. 60/452,903, filed Mar. 7, 2003, which application is incorporated herein in its entirety for all purposes.

FIELD OF THE INVENTION

The invention relates generally to signal analysis devices and, more specifically, to a method and apparatus for processing anomalous trigger event conditions.

BACKGROUND OF THE INVENTION

The trigger systems of digital storage oscilloscopes (DSOs) and other test and measurement devices may be set to trigger on simple events, such as edge and signal levels, as well as more complex events, such as glitch, slew-rate violation, abnormal pulse width, runt pulse and the like which could indicate, for example, a timing violation within a device under test (DUT) or other anomalous event. The only indication of how many such violations are occurring is the acquisition rate of the DSO, which does not measure the actual rate of occurrence of the specified trigger event. The acquisition rate of the DSO may be thousands of times slower than the trigger event rate, and a, user would never know it.

SUMMARY OF INVENTION

These and other deficiencies of the prior art are addressed by the present invention of a method and apparatus for processing anomalous trigger event conditions to provide anomalous trigger event rate measurement and, in various embodiments, spectral representations of anomalous trigger event conditions. In various embodiments, the invention also provides triggering of signal acquisition based on anomalous event rate levels and/or spectral profile correlation and other factors.

The subject invention is adapted, in one embodiment, to a method comprising detecting occurrences of at least one advanced trigger condition; and determining the number of detected occurrences during a predefined time interval to establish thereby a rate of the occurrences.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of an apparatus adapted for use within a digital storage oscilloscope (DSO). However, it will be appreciated by those skilled in the art that the methods and apparatus of the present invention may be advantageously employed in any single-channel or multi-channel signal measurement or analysis device.

It will be appreciated by those skilled in the art that standard signal processing components (not shown) such as signal buffering circuitry, signal conditioning circuitry and the like are also employed as appropriate to enable the various functions described herein. For example, where input signals are digitized or sampled they are sampled at a sufficiently high rate to enable appropriate processing by the various functional elements described herein.

Figure 1:
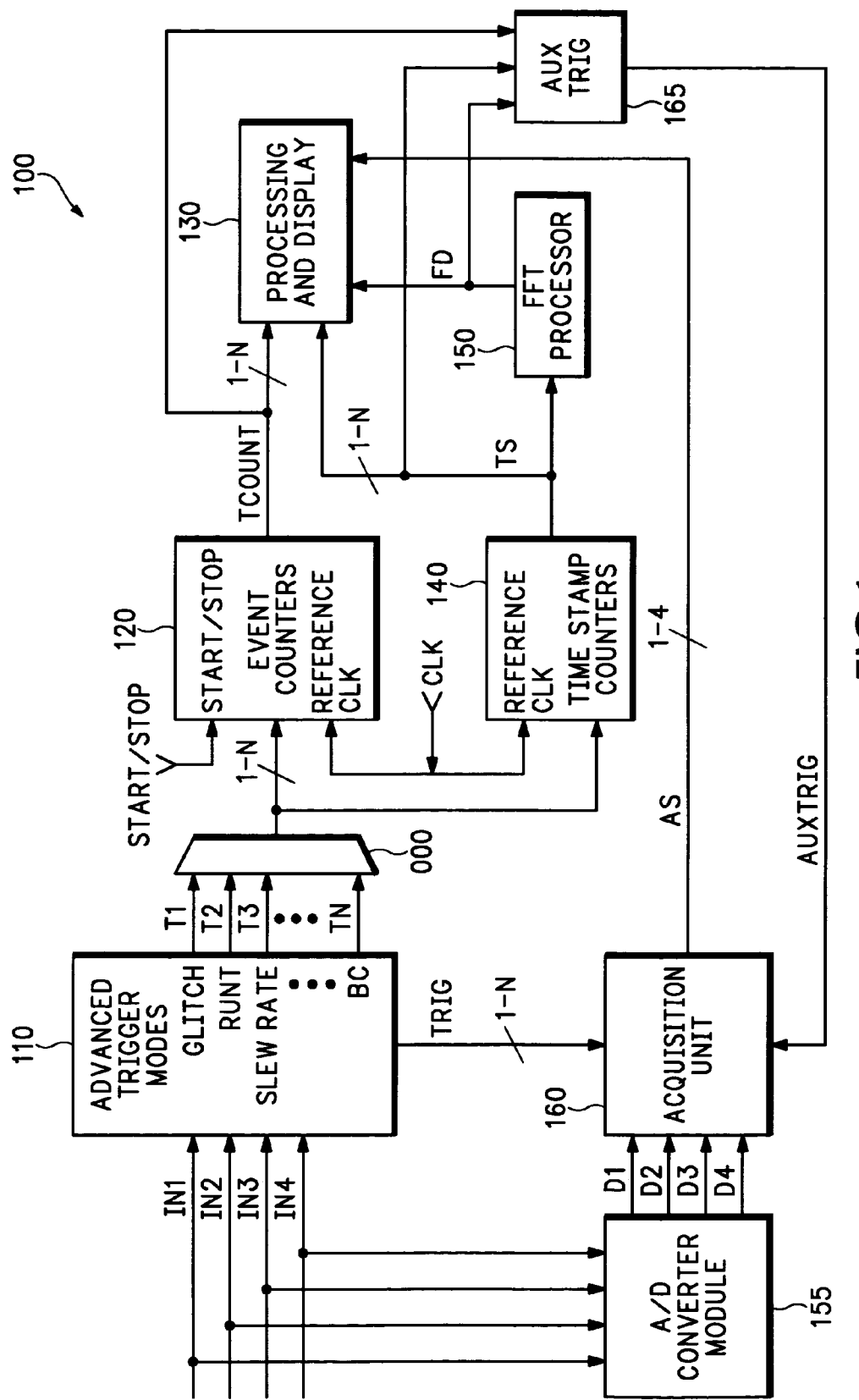
FIG. 1 depicts a high level block diagram of an apparatus according to an embodiment of the invention.

FIG. 1 depicts a high level block diagram of an apparatus according to an embodiment of the invention. Specifically, the apparatus 100 of FIG. 1 comprises an advance trigger mode module 110, a multiplexer 115, an event counter module 120, a display processor module 130, a time stamp module 140, a fast Fourier transform (FFT) processor 150, an analog to digital (A/D) converter module 155, acquisition unit 160 and an auxiliary trigger module 165.

The apparatus 100 of FIG. 1 operates to identify one or more trigger events in at least one input signal IN, determine the number of events during a period of time (e.g., events per second) and provide a visual representation of this determination to a user via a display device. The visual representation may comprise an alphanumeric display, a waveform, a graphic image proximate a waveform and the like. In another embodiment, the time stamp module associates a time stamp with indicia of individual instances of events or groups of events such that an indication of the time at which an event or group of events occurred may also be displayed to a user. In another embodiment, the time stamped event data is further processed to provide a frequency domain representation of the event(s). Any of these embodiments may be combined.

Referring to FIG. 1, advanced trigger mode module 110 receives at least one of a plurality of input channels (IN) depicted herein as input channels IN1 through IN4, though more or fewer input channels may be used. Advanced trigger mode module 110 performs at least one advanced triggering operation on at least one of the input channels. In the embodiment 100 of FIG. 1, the advanced trigger mode module 110 is depicted as receiving four input signals (IN1–IN4) and performing any of a plurality of advanced trigger modes (simple trigger modes may also be performed). The advanced trigger mode module 110 provides at respective outputs a plurality of trigger indicative signals T1 through TN, where each of the trigger indicative signals T indicates the occurrence of a respective trigger condition.

Specifically, the advanced trigger mode module 110 may be operated in one or more advanced trigger modes to identify events such as glitch, pulse width violation, slew-rate violation, runt or abnormal pulse, time-qualified runt or abnormal pulse, timeout condition, window criteria, set-up and hold violation, logic pattern, logic state triggering and other advanced trigger modes (as well as simple modes such as edge and level trigger conditions).

It is contemplated by the inventors that the advanced trigger module 110 may be a special purpose device that implements one, a few, or all the above enumerated trigger conditions as well as other trigger conditions. It is also contemplated by the inventors that the specific trigger conditions processed by the advanced trigger mode module 110 are, in some embodiments of the invention, user selectable and/or programmable. Such user selection or programmability is effected by, for example, user interaction with a user interface provided via, for example, the display processor 130 and various input circuitry such as associated with a touch screen input, pointing device, keyboard and the like (not shown).

The multiplexer 115 receives each of the trigger indicative signals T and responsively provides one or more (or all) of the trigger signals T to the event counter module 120 and timestamp counter module 140.

In addition to one or more selected trigger signals T, each of the event counter module 120 and time stamp module 140 also receives a reference clock CLK from, for example, a system clock or timer unit (not shown). The event counter module 120 also receives a start/stop signal from a controller (not shown), such as a microprocessor or computing device associated with a test and measurement instrument within which the apparatus 100 of FIG. 1 is included. The event counter module 120, in response to a START signal, begins counting each occurrence of one or more of the advanced trigger conditions as indicated by the respective trigger signals T1 through TN. The event counter module 120, in response to a STOP signal, stops counting the occurrences of advanced trigger mode conditions and provide one or more output signals TCOUNT to the display processor module 130.

The processing and display unit 130 comprises, illustratively, a display device (not shown) and associated data processing circuitry suitable for converting received data streams, such as acquired data, trigger count data, spectral information and the like, into visual imagery. The processing and display unit 130 is responsive to a controller (not shown) to set various parameters such as volts per division, time scale and the like.

The processing and display module 130 is responsive to the trigger count signal TCOUNT to display information indicative of an occurrence rate for at least one of the trigger signals T provided by the event counter module 120. The display processor module 130 may cause a numeric indication of the rate of each anomalous trigger event to be displayed. Moreover, the display processor 130 may also provide a specific trace or waveform having associated with it a pulse which a user may superimpose over another trace or waveform to visually associate thereby a particular repetitive anomalous trigger.

The above-described portion of the apparatus 100 of FIG. 1 comprises a first embodiment of the invention and several modifications thereof. Generally speaking, the above-described apparatus operates to identify one or more trigger events in at least one input signal IN, determine the number of events during a period of time (e.g., events per second) and provide a visual representation of this determination to a user via a display device. The visual representation may comprise an alphanumeric display, a waveform, a graphic image proximate a waveform and the like.

In one embodiment of the invention, the time stamp module 140 is utilized to associate each trigger event T (or group of trigger events) with a respective time stamp. The time stamps are derived via the reference clock CLK. The time stamp module 140 provides one through N time stamped signals TS to display processor 130. The display processor 130 utilizes the optional time stamped signals TS to provide additional visual data for the user within the time domain. Such additional data may be displayed on a display device as an overlay or associated with an additional waveform such that time domain coincidences between anomalies and actions may be viewed by a user. In one embodiment, a histographic distribution of the anomaly rates is derived using the time stamp data. Using the histographic data and/or the time stamps themselves, one embodiment of the invention provides for further statistical processing to determine average, median, min-max, standard deviation and other statistical data, which data may then be displayed to a user.

In one embodiment, the FFT processor module 150 is utilized to receive one or more time stamped signals TS from the time stamp module 140 and responsively perform a fast Fourier transform (FFT) to provide thereby a spectral profile of the time stamped signals TS. The FFT processor module 150 provides the resulting frequency data FD to the display processor 130 for further display. The frequency data FD may be used to generate waveform imagery or other numeric or alphanumeric imagery which may be viewed by a user to gain additional insight of the device under test or its operating conditions.

The inventor has determined that the rate at which an anomalous trigger event occurs provides extremely useful information in debugging complex systems. If the rate of an anomalous event can be correlated to another event in the system, then such rate data can become a primary diagnostic tool for uncovering error. For example, if runt trigger conditions are happening at exactly the same rate that a given bus is being read, then the user can conclude that the act of reading the bus might be causing the runt signals causing the trigger condition.

Within the context of a signal measurement or analysis device such as a DSO, additional signal processing/acquisition circuitry is present. In the apparatus of FIG. 1, in an exemplary embodiment, each of the input signals IN1–IN4 is also provided to an analog-to-digital (A/D) converter module 155. The A/D converter module 155 samples each of the input signals IN1–IN4 at an appropriate sample rate to produce corresponding digital sample streams D1–D4, which sample streams are coupled to acquisition unit 160. The acquisition unit 160 comprises, illustratively, at least one decimator for each of the input signals as well as supporting acquisition memory. The acquisition unit 160 is responsive to one or more trigger signals TRIG provided by the advanced trigger mode module 110 to produce one or more acquired sample streams AS suitable for use by the processing and display module 130. The one or more trigger signals TRIG may also be provided by conventional trigger circuitry (not shown). The acquisition unit 160 is optionally responsive to a controller (not shown) to change decimator functions, memory allocations and other functions as appropriate, and as appreciated by those skilled in the art informed by the present disclosure. The acquisition unit 160 may also communicate acquired data, such as the acquired sample stream(s) AS to the controller for further processing.

In alternate embodiments of the invention, the auxiliary trigger module 165 receives the trigger count signal TCOUNT provided by the advanced counter module 120, the one or more time stamped signals TS provided by the time stamp module 140 and the frequency data FD provided by the FFT processor module 150. In response to these signals individually, or in any combination, the auxiliary trigger module 165 produces an auxiliary trigger AUXTRIG that is communicated to the acquisition unit 160 for use in conjunction with or as a replacement for the trigger signal TRIG previously discussed. Generally speaking, the auxiliary trigger module 165 processes individual trigger events or aggregates a plurality of trigger events to produce the auxiliary trigger signal AUXTRIG. The auxiliary trigger module 165 is optionally modified or controlled via user interaction with a controller (not shown).

The auxiliary trigger signal AUXTRIG may be asserted by the auxiliary trigger module 165 in response to these and other conditions: a determined anomalous trigger event rate above a threshold level, a determined anomalous trigger event rate below a threshold level, a determined anomalous trigger event rate within a threshold level window, changes in a determined anomalous trigger event rate above a threshold level (e.g., using the timestamps to determine whether a determined anomalous trigger event rate is increasing and/or decreasing within a predefined time period), a determined spectral profile conforming to a predefined spectral profile to a threshold level of accuracy and, generally, any combination of criteria within the signals provided to the auxiliary trigger module 165.

Figure 2:
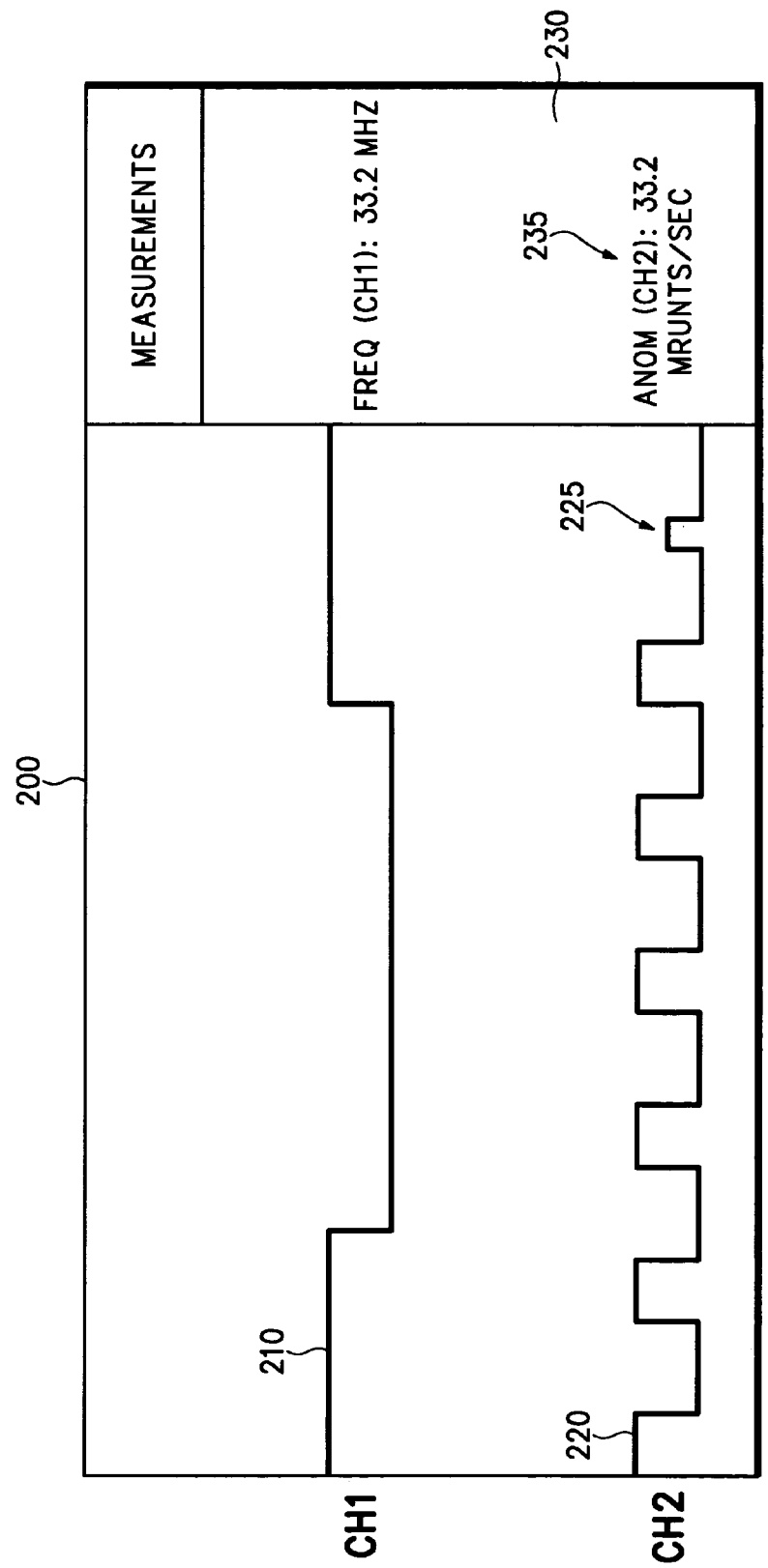
FIG. 2 depicts display imagery according to an embodiment of the invention.

FIG. 2 depicts display imagery according to an embodiment of the invention. Specifically, FIG. 2 depicts an image suitable for display on, for example, a DSO or other test and measurement device. The display image 200 comprises a channel one waveform 210 and a channel two waveform 220. As noted in a definition box 230, the channel one waveform 210 has a frequency of 33.2 MHz. The channel two waveform 220 also includes a runt pulse 225. As also noted in the definition box 230, channel two represents an anomalous condition (e.g., the runt pulse or other anomalous condition), and the anomalous condition occurs at a rate of 33.2 million runt pulses per second. Thus, FIG. 2 illustrates the display of rate data as both a waveform (i.e., the runt pulse 225 within the channel two waveform) as well as an alphanumeric display 235.

While the foregoing is directed to the preferred embodiment of the present invention, other and further embodiments of the invention may be devised without departing from the basic scope thereof, and the scope thereof is determined by the claims that follow.

What is claimed is:

1. Apparatus, comprising:
    an advanced trigger module, for generating a plurality of trigger condition indicative signals in response to trigger events occurring in at least one input signal;
    a multiplexer, for receiving from said advanced trigger module each of said plurality of trigger condition indicative signals and selecting therefrom one of said trigger condition indicative signals for further processing; and
    an event counter module, for counting the number of said selected trigger condition indicative signals occurring during a predefined time period to establish thereby a rate of occurrence of said selected trigger condition indicative signals.

2. The apparatus of claim 1, further comprising:
    a time stamp module, for associating at least some of occurrences of said selected trigger condition indicative signals with a respective time stamp for subsequent processing by said display processor.

3. The apparatus of claim 2, wherein each of said selected trigger condition indicative signals is associated with a time stamp.

4. The apparatus of claim 1, further comprising:
    a time stamp module, for associating at least some occurrences of said selected trigger condition indicative signals with a respective time stamp for subsequent processing by a fast Fourier transform(FFT) module;
    said FFT module for processing at least one time stamp associated trigger condition indicative signal to provide thereby a spectral profile of occurrences of said trigger event.

5. The apparatus of claim 4, further comprising:
    an auxiliary trigger module, for asserting a trigger condition in response to a spectral profile correlating to a predefined spectral profile within a threshold level of accuracy.

6. The apparatus of claim 1, wherein said trigger event comprises at least one of a glitch condition, a pulse width violation condition, a slew-rate violation condition, a runt condition, a time-qualified runt condition, an abnormal pulse condition, a time-qualified abnormal pulse condition, a timeout condition, a window criteria condition, a set-up and hold violation, a logic pattern, a logic state and an edge condition.

* * * * *